(12) United States Patent
Nakanishi

(10) Patent No.: US 6,756,252 B2
(45) Date of Patent: Jun. 29, 2004

(54) MULTILAYER LASER TRIM INTERCONNECT METHOD

(75) Inventor: Noboru Nakanishi, Beppu (JP)

(73) Assignee: Texas Instrument Incorporated, Dallas, TX (US)

( * ) Notice: Subject to any disclaimer, the term of this patent is extended or adjusted under 35 U.S.C. 154(b) by 0 days.

(21) Appl. No.: 10/197,165

(22) Filed: Jul. 17, 2002

(65) Prior Publication Data

US 2004/0014309 A1 Jan. 22, 2004

(51) Int. Cl.[7] .............................................. H01L 21/44
(52) U.S. Cl. ...................... 438/118; 438/108; 438/111; 438/123; 438/613; 438/617
(58) Field of Search ................................ 438/108, 109, 438/111, 112, 117, 118, 123, 612, 613, 614, 617; 257/668, 669, 673, 674, 676, 685, 686, 688, 689, 692, 693, 695, 737, 777, 778, 779, 781, 782, 784

(56) References Cited

U.S. PATENT DOCUMENTS 5,278,726 A * 1/1994 Bernardoni et al. ........ 361/783
5,891,795 A * 4/1999 Arledge et al. ............. 438/613
6,225,570 B1 * 5/2001 Ishiyama et al. ........... 174/260

* cited by examiner

Primary Examiner—Hung Vu
(74) Attorney, Agent, or Firm—Bret J. Peterson; W. James Brady, III; Frederick J. Telecky, Jr.

(57) ABSTRACT

A method for creating electrical interconnects between a semiconductor die and package. In the preferred embodiment, an insulating material is applied over the die and extends to the substrate contact pads, leaving a portion of each contact pad exposed. Holes are then trimmed through the insulating material, exposing at least a portion of each die bond pad. A conductive material is then applied over the die, flowing into the holes, contacting the die bond pads, and extending out to contact at least a portion of each substrate contact pad. In another preferred embodiment, an electrically conductive bump may be formed on each die bond pad, protruding through said non-conductive material and at least partially through said conductive material. The conductive layer is then laser trimmed, forming conductive patches that serve as electrical interconnects between the die and package substrate.

11 Claims, 16 Drawing Sheets

MULTILAYER LASER TRIM INTERCONNECT METHOD

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to a method for semiconductor packaging and assembly, and in particular to a method for creating improved interconnections between a die and package substrate. Still more particularly, the invention relates to a method for creating interconnects with subsequent layers of insulating and conductive materials.

2. Background Information

Modern-day semiconductor devices, commonly called microchips, or "die," are fabricated on wafers, and the wafers are then sawn into grids, separating the individual chips prior to assembly in a package. Chips are fabricated in a variety of sizes, but typically range from only a few millimeters to a couple of centimeters or more in width. Each chip has numerous electrical signals. Processors, for example, may have several hundred signals. Provisions must be made to electrically connect a die to the component with which it is used (typically, other electrical devices and connections on a printed circuit board) and also to protect the die from damage or other external conditions that could hinder its operation. Package engineering, or packaging, is the field within semiconductor engineering that addresses these needs.

Typically, as a die is designed, a packaging team will assess its layout and other requirements to determine the ideal packaging solution. A myriad of requirements may exist for a particular device, including thermal, reliability, moisture, electrical, package size and cost requirements. As semiconductor devices increase in complexity and shrink in size, packaging them is becoming more and more challenging as a greater numbers of electrical signals and other connections, such as grounds, have to be routed from increasingly smaller chips. As this "pin count" increases, new methods must be found to electrically connect the die to the board while continuing to meet increasingly aggressive packaging needs.

Referring now to FIG. 1, signals are typically routed from a die 10 by a ring of substantially square electrical "bond pads" 12 located on the edge of the die surface 14. These miniscule bond pads 12 may be less than five one-hundredths of a millimeter (0.05 mm) wide, and spaced just slightly farther apart, to account for surrounding circuitry 16.

Historically, as shown in FIG. 2, chips with a relatively low "pin count," or number of bond pads, have been packaged using "leadframes" 20, thin etched or stamped metal frames which have a central area, or flag 22, to which a chip is attached. Referring now to FIG. 3, leadframes 20 generally have metal "fingers" 30, pointing inward towards flag 22, which are connected to substantially square electrical "bond pads" 12 around the edge of die 10 with hair-like wires 32, which may be 25 thousandths of a millimeter (0.025 mm) or smaller in diameter. This assembly process, called "wirebonding," is performed by extremely precise robotic machines called wirebonders (not shown). FIG. 4 shows a full die 10 wirebonded to a leadframe 20.

As shown in FIG. 5, once the die 10 has been attached to flag 22 by an epoxy 50 or other adhesive and bonded to leadfingers 30 with wires 32, the die 10 is then encapsulated, typically with a solid plastic mold compound 52, or ceramic housing (not shown). Lead fingers 30 then carry the signals out of the edges of the package 54 by doubling as "feet" 56 that are fashioned to contact or pass through specific electrical "lands" (not shown) on the board 58.

Several issues exist with peripherally leaded packages. For instance, as all the signals on the die must be routed out the edge of the package, as pin count increases, the footprint of the package may be undesirably forced to increase geometrically since the package area is not utilized for interconnects. Current leaded packages are typically offered in certain predetermined pin counts (such as 100, 112, or 144 leads) with each pin count corresponding to a certain size package (e.g., 10×10, 14×14 or 20×20 mm). For this reason, small increases in the pin count of the die can cause relatively large increases in overall package area, since exceeding the number of pins in one package size would force the die into the next larger package family.

The desire to reduce the size of consumer and other types of electronics (e.g., cell phones, laptop computers, etc.) creates pressure on chip manufacturers to reduce the size of semiconductor packages. Further, a myriad of issues exists with wirebonding, the default interconnect method used with leadframe packages. Referring now to FIG. 6, in the case of plastic packaging, a solid mold compound (not shown) is often unidirectionally injected into the corner of a mold cavity (not shown) around the wirebonded die 10 and spreads out in a pattern 60. The solid mold compound serves to protect the chip and interconnects.

As the mold compound spreads over die 10, it contacts and pushes against wires 32 causing them to bend out or "sweep" a small distance as shown. For this reason, packaging design guidelines limit wire length and pitch, or the distance between adjacent wires 32, to prevent shorting. For a fine-pitch die, or a die that requires a wire pitch smaller than current high-volume industry standards, and thus, requires a special wirebonder and thinner wires 32, the issue of wire sweep becomes even more troublesome.

Wire sag is also an issue with relatively long or thin wires, which have an inherent sag under their own weight due to their extremely small cross-sections. It is essential that wires do not contact the edges of the die or lead fingers to prevent physical damage. A satisfactory wirebond 32 is shown in FIG. 7A, whereas FIG. 7B shows a drooping wire 32 coming into close contact with the edges of both the die 10 at 72 and lead fingers 30 at 74.

Wirebonding also adds unwanted height to a package 54, since a wirebonding tool (not shown) will typically create a bond by forming a small ball of metal 70 on a bond pad 12 on the edge of die 10, then arc a wire 32 up from ball 70, finally stitching it out to a finger 30 on leadframe 20. For small products, such as cell phones or other popular mobile devices, any added semiconductor package height is undesired.

For these reasons, die with high pin counts or die used in small electronics typically utilize area array packages, one of the most common being the ball grid array (BGA) 80, as shown in FIG. 8A, in which an array of solder balls 82 covers at least part of the bottom surface of a thin, multi-layered board, or substrate 84.

As shown in FIG. 8B, when assembled in a BGA package 80, the die 10 is bonded to the central flag 86 of substrate 84, rather than a metal leadframe. Instead of routing signals from the package periphery down to the board 58 as with a leadframe package, in an area array package, a die 10 may be wirebonded out to conductive "traces" 88 on the substrate 84. These individual traces 88 can pass down through the substrate layers using electrically conductive channels, or vias 89, and down to the bottom layer of the substrate 84, where they are routed to an array of solder balls 82, which serve as interconnects to a matching array on the board 58.

Packaging using substrates 84 affords considerable routing flexibility, as space may be conserved by overlapping different signal traces 88 on different layers of the substrate 84. Further, sensitive signals, which would otherwise interfere with one another if routed out adjacently, may be isolated from one another by surrounding them on the substrate bottom with surplus balls 82.

While area array packaging has met many packaging challenges, the practice of wirebonding still limits the capabilities and features of a packaged device. More advanced methods of attaching a die to a substrate do exist, such as Controlled Collapse Chip Connection (C4) flip-chip packaging, or simply "flipchip," a method in which electrical pads on the top surface of a die are mounted with conductive balls (or "bumped") then flipped over and bonded top-side-down to similar bumps on the substrate surface.

However, the flipchip process is technically intricate and comparatively expensive, since the bump array on the substrate surface must exactly match that of the die. Also, there is little wiring flexibility, and bumps are difficult to apply to fine-pitch die. These custom, exclusive-use substrates often do not achieve the manufacturing volumes of more generic packaging means, and consequently can be much more expensive. Unlike the exclusive-use substrates used with a flipchip device, the present invention could be used with existing die with peripheral bond pads and existing substrates, without need for custom substrates.

As chip power and pin counts continue to increase and die sizes continue to shrink, thermal and electrical concerns increase concurrently. Removing heat generated by a die is critical in maintaining chip performance, and robust interconnects are needed to adequately handle the electrical output of a high-powered chip. As noted above, it is often desirable to design the smallest die possible. However, occasionally the size and number of bond pads needed for wirebonding around the die edge will force the die to be larger than it otherwise would need to be if, as shown in FIG. 9A, components 90 in the center of the die were small enough to leave unused space between them and the ring of bond pads 12. In this case, staggered rows of bond pads 12, as shown in FIG. 9B, could be used on a die 10, but this solution is often avoided due to reduced wire pitches and greater possibility for wire sweep and shorting. Therefore, a packaging interconnect method is needed that maintains or improves upon the benefits of current packaging technology while addressing one or more of the aforementioned issues.

BRIEF SUMMARY OF THE PREFERRED EMBODIMENT OF THE INVENTION

The problems noted above are solved in large part by a method of creating electrical interconnects between a die and package without the use of wirebonds. Without wirebonds, the problems discussed above are eliminated or at least ameliorated to a great extent. Accordingly, the preferred method is to electrically connect a die and package substrate by applying an electrically non-conducting material over a die, extending onto the package substrate, and leaving a portion of the substrate contact pads exposed. An electrically conductive material is then applied over the non-conductive layer, coming into electrical contact with the die preferably by flowing into holes formed in the insulating layer over the die bond pads or by contacting conductive bumps which are formed on the die bond pads and protrude through the insulating layer. Portions of the conductive layer are then selectively removed to form conductive patches between electrical points of contact on the die and substrate contact pads, respectively. Further, the preferred method entails spraying a layer of conductive ink over an insulating epoxy or polyimide layer, then laser trimming the conductive ink layer to create separate connection traces.

BRIEF DESCRIPTION OF THE DRAWINGS

For a detailed description of the preferred embodiments of the invention, reference will now be made to the accompanying drawings, wherein:

FIG. 13 is a cross-sectional view of a bumped die with staggered bond pads in accordance with a preferred embodiment of;

DETAILED DESCRIPTION OF THE PREFERRED EMBODIMENTS

Figure 10A:
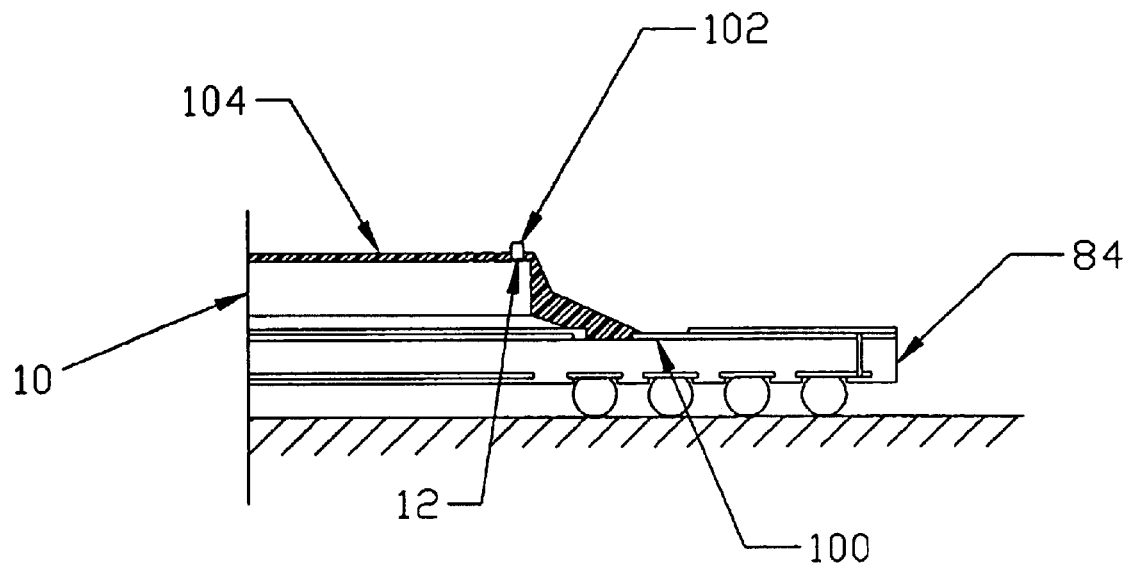
FIG. 10A is a cross-section view of a bumped die covered with an insulating layer in accordance with a preferred embodiment of the present invention.
Figure 10B:
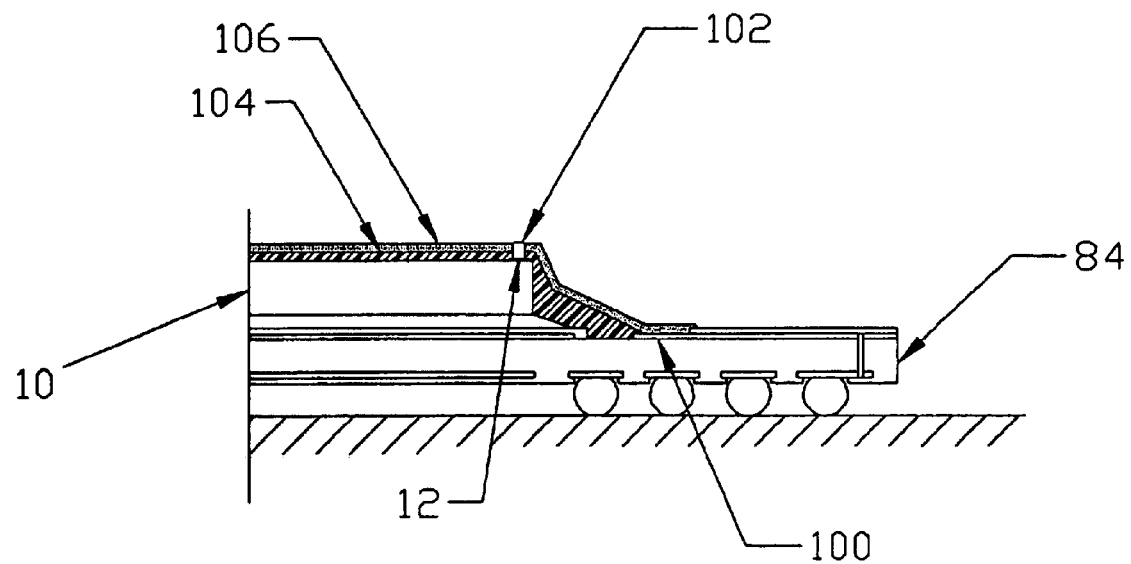
FIG. 10B is a cross-section view of a bumped die covered with insulating and conductive layers in accordance with a preferred embodiment of the present invention.
Figure 10C:
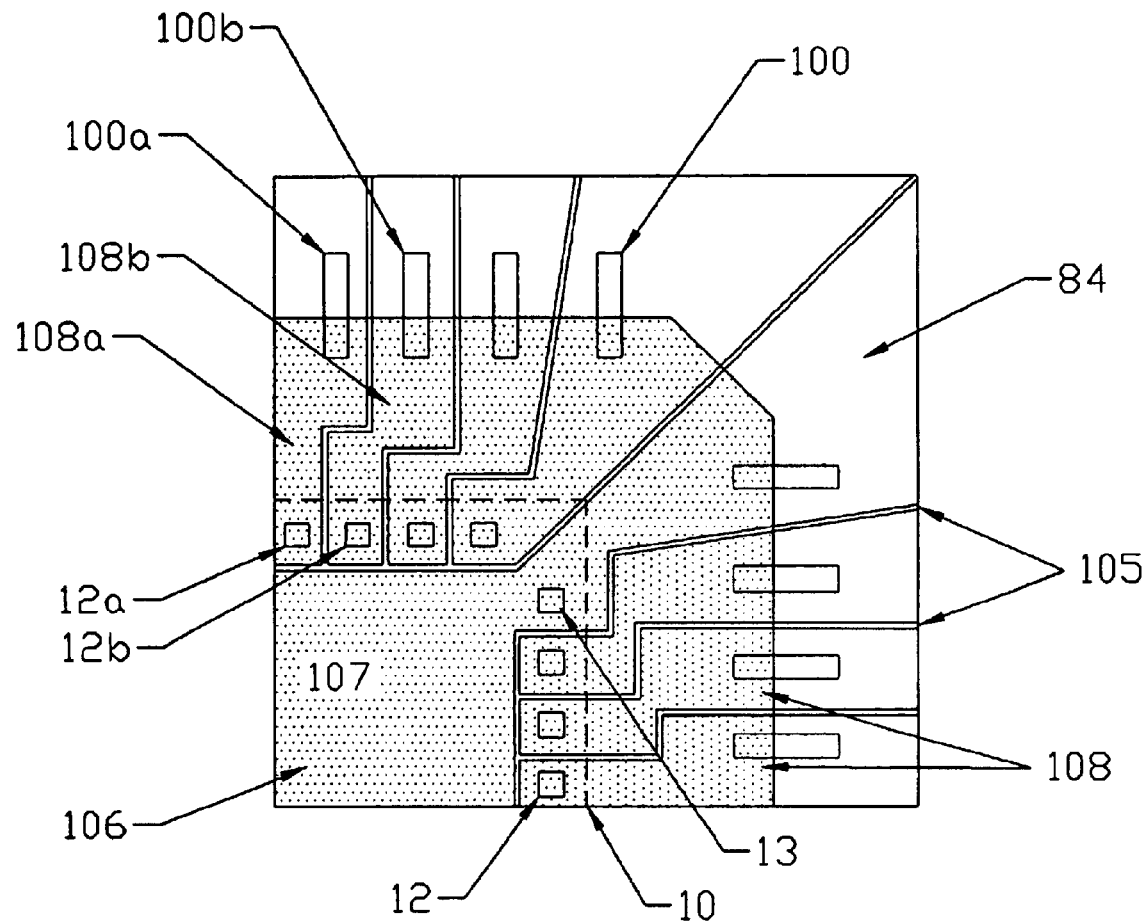
FIG. 10C is a top view of a die bonded to a substrate with conductive patches in accordance with a preferred embodiment of the present invention.

Broadly, the preferred embodiments of the present invention provide a method for creating interconnects between a semiconductor die and a package substrate. The preferred methods generally includes applying a conductive layer over an insulating layer, and then using a laser or other suitable mechanism to remove or otherwise trim away portions of the conductive layer, thereby forming conductive patches. FIGS. 10A–10C illustrate one preferred embodiment of the present invention.

As shown in FIG. 10A, a die 10 is attached to a package substrate 84. One or more bond pads 12 are formed on the upper surface of die 10 at or near the periphery of the die. The bond pads 12 are formed of a conductive material in accordance with known techniques and may serve as electrical points of contact for connecting die 10 to the package substrate. The upper surface of the substrate 84 includes one or more contact pads 100 formed thereon, generally by exposing an underlying metal layer by known assembly techniques. Electrical interconnects are created between the die's bond pads 12 and the contact pads 100 of a package substrate 84 without using conventional wirebonds, and thus, avoiding the problems noted above associated with wirebonds. In a preferred embodiment of the present invention, conductive "bumps" 102, preferably made of metal, are also formed on bond pads 12 on the die periphery. The bumps 102 are electrically connected to circuits in the die and may alternately serve as the electrical points of contact on die 10 in accordance with a preferred embodiment of the present invention.

An insulating layer 104, preferably any suitable non-conducting material which can be applied to the die, such as epoxy or polyimide, is applied to the top and sides of the die 10. The insulating layer 104 is preferably formed by spinning or spraying on a material. The insulating layer 104 preferably extends from the upper surface of die 10 outward to contact pads 100 on the substrate 84, exposing at least a portion of contact pads 100. The conductive metal bumps 102 preferably are tall enough so that at least a portion of the bumps 102 protrude up and through the insulating layer 104.

FIG. 10B shows the next step in the process of forming an interconnect in accordance with the preferred embodiment of the invention. Referring now to FIG. 10B, a layer of conductive ink 106 is sprayed or otherwise applied over the insulating layer 104 on die 10 and exposed areas of contact pads 100 on substrate 84. The conductive ink 106 preferably is composed of Acheson Electrodag® or other suitable conductive material that meets the thermal, electrical, reliability and other assembly requirements of the particular die that would be decided in the design conception stage. As noted above, metallic bumps 102 protrude at least slightly through insulating layer 104 after it is applied, coming into electrical contact with the conductive layer 106.

The next step in the process is illustrated in FIG. 10C, in which is shown a top view of a portion of die 10 attached to a substrate 84 is shown. The portion of the die 10 shown in FIG. 10C is denoted by the dashed line. The conductive ink 106 is denoted by the shaded pattern that covers the die 10 and extends away from die 10 to contact pads 100. Conductive ink 106 preferably comes into physical contact with and covers a large portion of each contact pad 100 to be connected. The sheet of conductive ink 106 is preferably laser scribed to trim away portions 105 of ink layer 106, leaving patches 108 of conductive ink 106 formed between the trimmed-away portions 105. The conductive patches 108 connect the die bond pads 12 to corresponding substrate contact pads 100. For example, two of the die bond pads 12 are labeled as 12a and 12b. Their associated substrate contact pads are labeled as 100a and 100b, respectively. Conductive patch 108a electrically connects die pond pad 12a to substrate contact pad 100a. Similarly, conductive patch 108b electrically connects die pond pad 12b to substrate contact pad 100b.

As shown in FIG. 10C, it is also possible with the preferred embodiments of the present invention to trim the conductive layer 106 so that a grounded die bond pad 13 is connected to a large plane 107 of the conductive layer on the die surface, thus using conductive layer 106 as a large conduit for the heat to travel off the die and down to the substrate. Heat buildup, especially on high-powered die, can adversely affect die performance. In another embodiment, the conductive material contacting a die bond pad 12 may be connected to an insulating layer on the substrate away from the die, instead of to a substrate contact pad.

Figure 11:
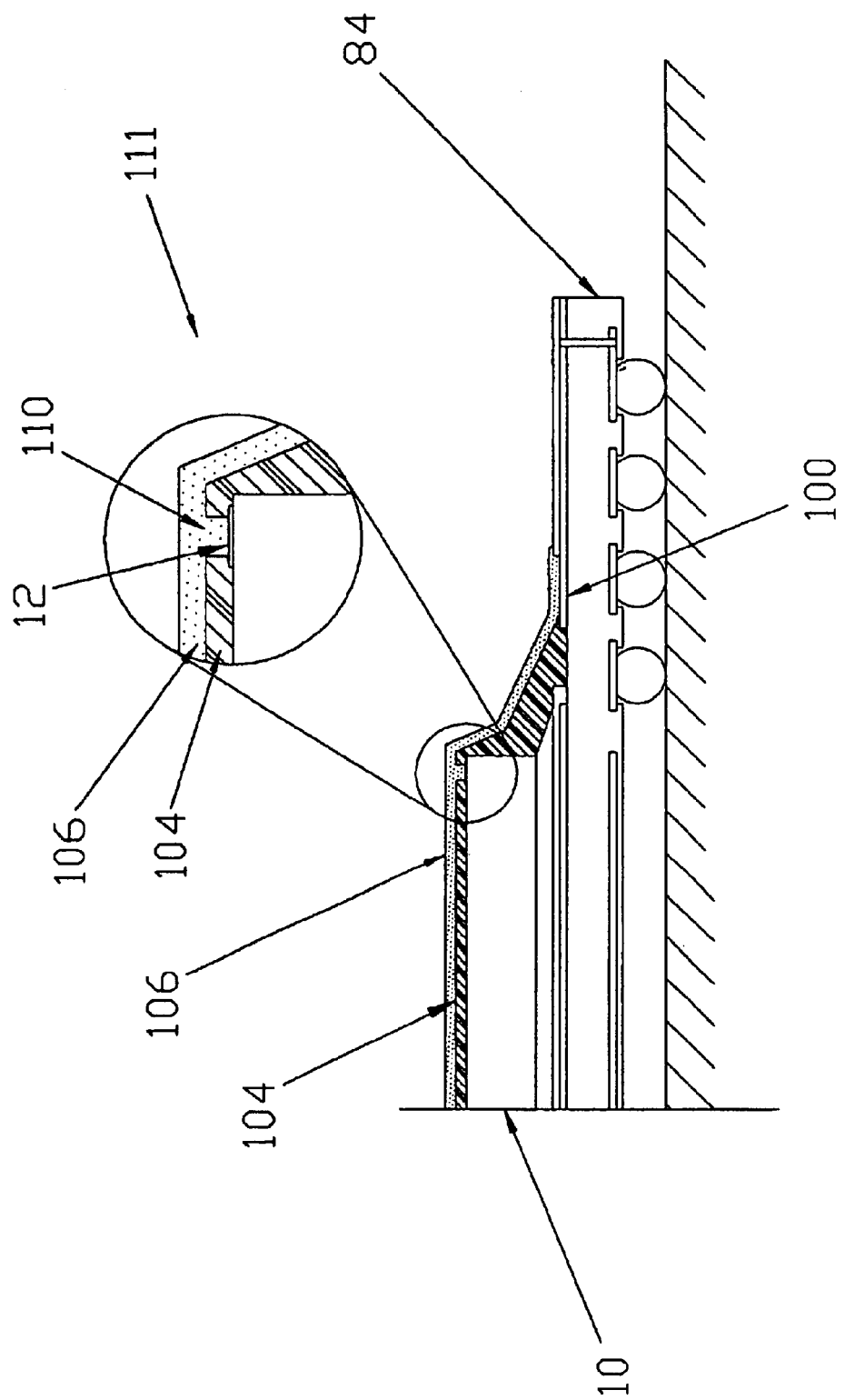
FIG. 11 is a cross-sectional view of an unbumped die covered with insulating and conductive layers in accordance with an alternate embodiment.

Alternatively, the die 10 may be unbumped, as shown in FIG. 11. Reference numeral 111 is a close-up showing holes 110 which must be cut into insulating layer 104 down to the die bond pads 12 prior to conductive layer application so that the conductive ink 106 can flow down into holes 110, thereby contacting die bond pads 12.

The preferred embodiments of the present invention have many advantages over current assembly methods. Since the interconnects of the preferred embodiments disclosed herein are formed as fixed layers of conductive material and not flexible wires, when the package is molded, there is no movable interconnect, and as such, the problem of wire sweep is avoided. By eliminating wires, the preferred embodiments also eliminate the possibility for wire sag, giving an added level of packaging robustness. Further, wire height is no longer a concern, as the relatively flat insulating and conductive layers eliminate an arcing wire above the die, generally allowing for flatter packages.

Figure 12:
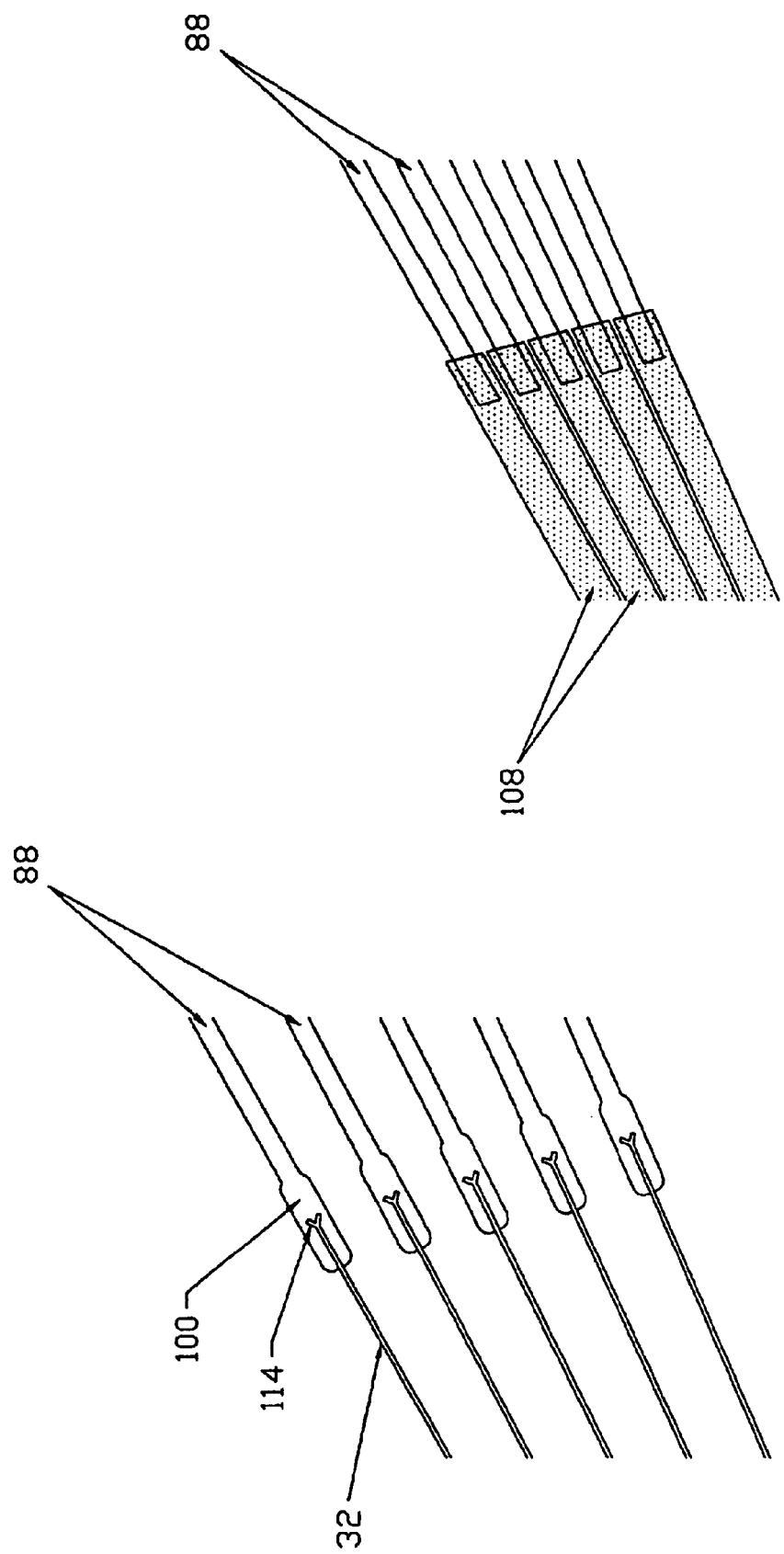
FIG. 12A is a top view of substrate traces interconnected with conventional wirebonds.
FIG. 12B is a top view of substrate traces interconnected with conductive patches in accordance with a preferred embodiment of the present invention.

An additional benefit of the preferred embodiments of the present invention is its applicability to fine-pitch die. As shown in FIG. 12A, when a typical substrate package is wirebonded in accordance with conventional techniques, a contact pad 100 somewhat larger than the adjoining trace 88 is required, to allow for a "stitch" bond 114 at the end of a wirebond 32. Also, traces 88 must be spaced sufficiently far apart to avoid shorting between wirebonds due to wire sweep. Referring now to FIG. 12B, in the present invention, since the entire area of traces 88 exposed to conductive patches 108 serves as the "bond," there is no need for a contact pad 100 wider than the adjoining trace 88. In addition, because there are no sweepable wires in the preferred embodiments, and thus, no risk for wires shorting, traces 88 can be placed much more closely together, as shown in FIG. 12B. This flexibility is beneficial in designing a smaller die and package.

Consequently, in addition to lessening many of reliability issues associated with the wirebonding process, the preferred embodiment of the present invention also raises the possibility for yield improvements due in combination to the more robust physical structure of the interconnects of the preferred embodiments and to the smaller die and package sizes possible. Since die are fabricated on wafers, the smaller the die, the more die can be fabricated on a single wafer, thereby lowering manufacturing costs and raising assembly throughput.

As die are assembled into semiconductor packages, more robust assembly methods, such as the laser trim interconnect method of the preferred embodiment, allow for higher overall manufacturing yields, thus making the chipmaking process more profitable. Additionally, smaller packages are often more desirable to electronics companies, as the board area, or "real estate," they use inside an electronic device is reduced. Smaller boards allow companies to market smaller electronic products or to include additional functionality on existing designs.

In addition to reliability improvements over wirebonding, the preferred embodiments also provides particular electrical benefits. The miniscule bonding wires 32 shown in FIG. 12A are replaced with relatively wide conductive patches 108 shown in FIG. 12B, relatively flat areas of conductive material slightly wider than a substrate trace 88. Due to their larger cross sections, these wider, rectangular interconnect patches 108 have a lower resistance than bonding wires 32, thereby reducing interconnect delays, and thus, improving electrical performance. Also due to their width, as noted above, these patches 108 also serve as a superior conduit for heat to be removed from the die surface more efficiently than with a conventional wire.

Figure 1:
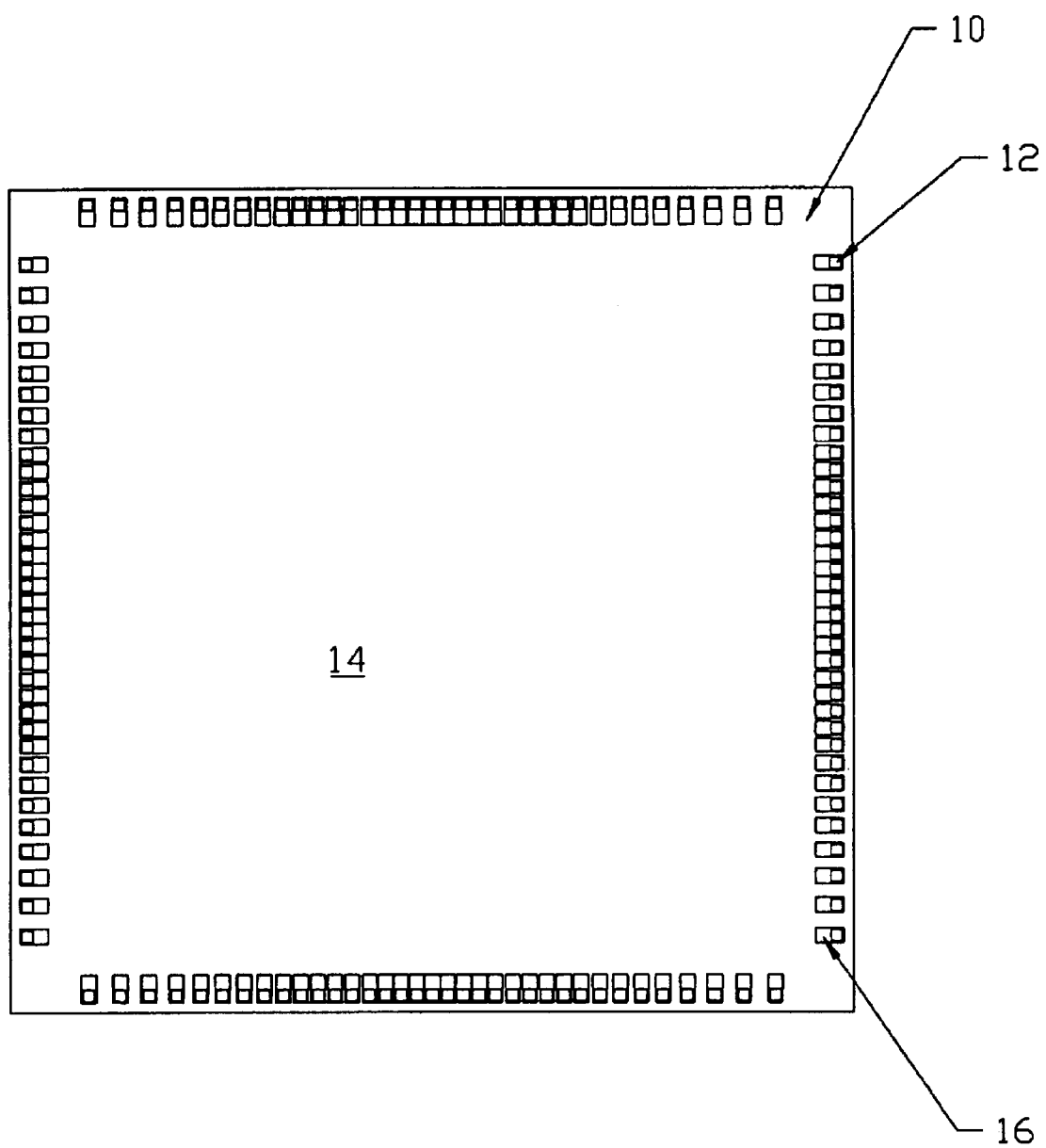
FIG. 1 is a top view of a conventional die.
Figure 2:
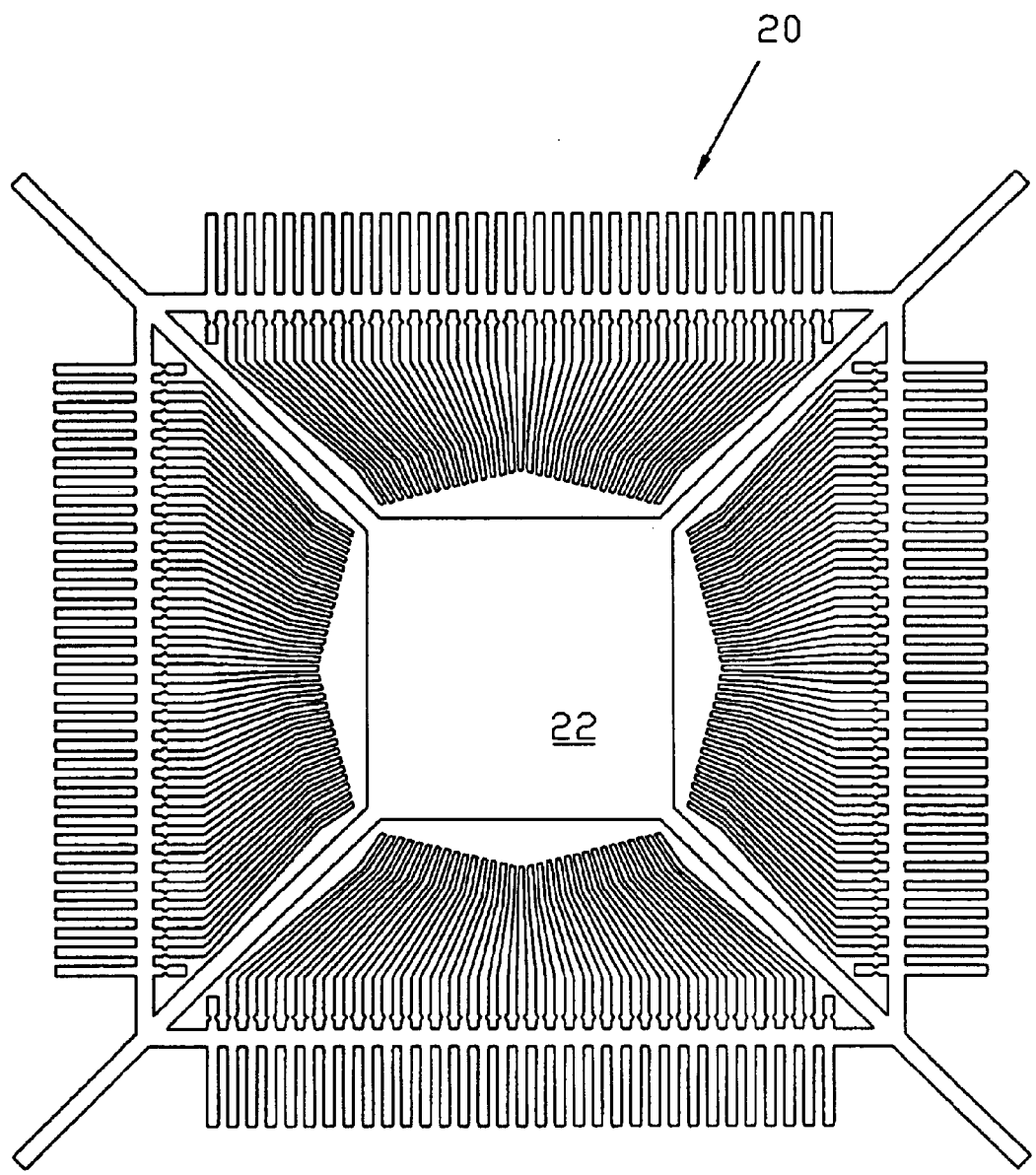
FIG. 2 is a top view of a conventional leadframe.
Figure 3:
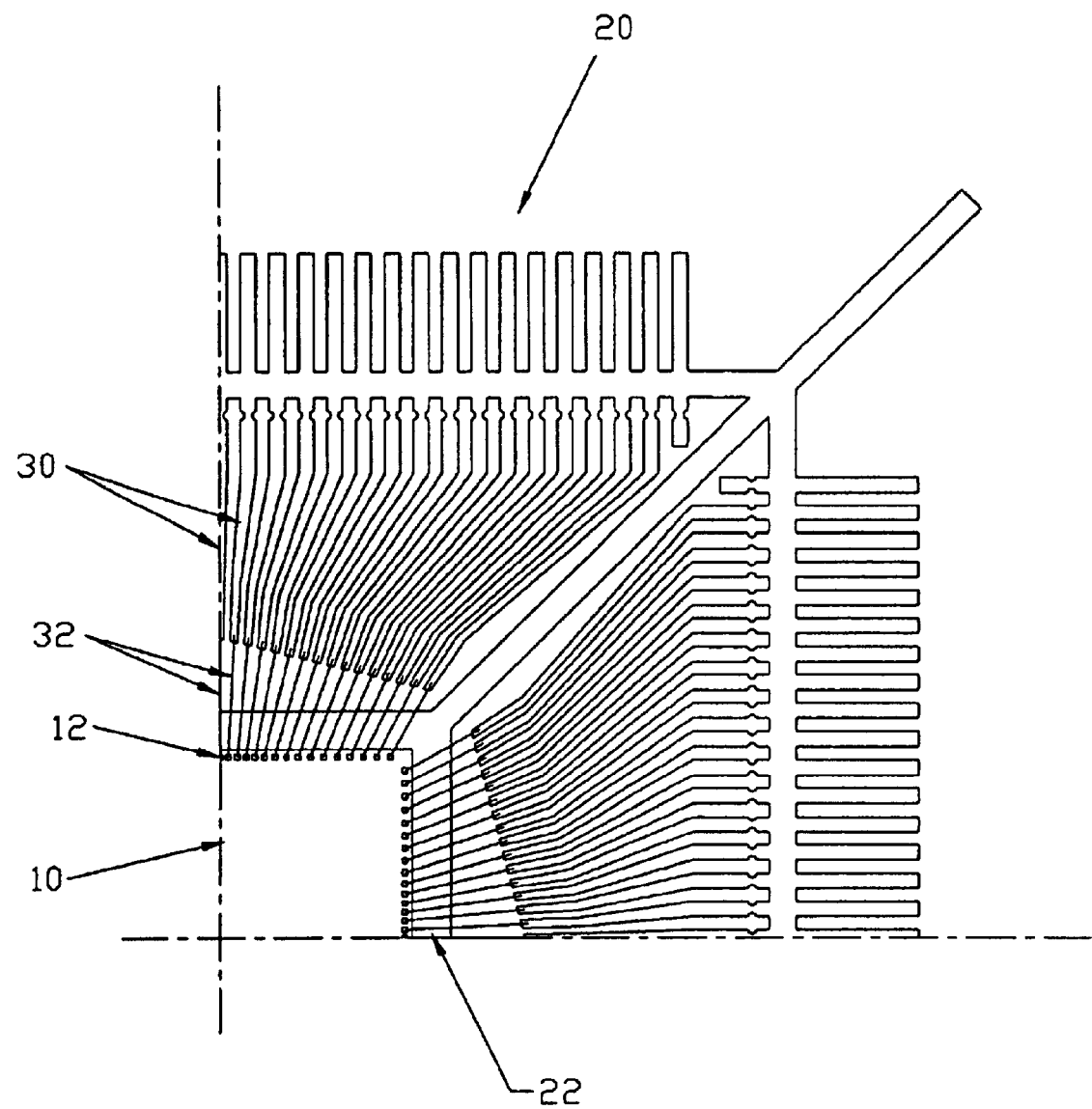
FIG. 3 is a top view of a corner of a conventional die wirebonded to a leadframe.
Figure 4:
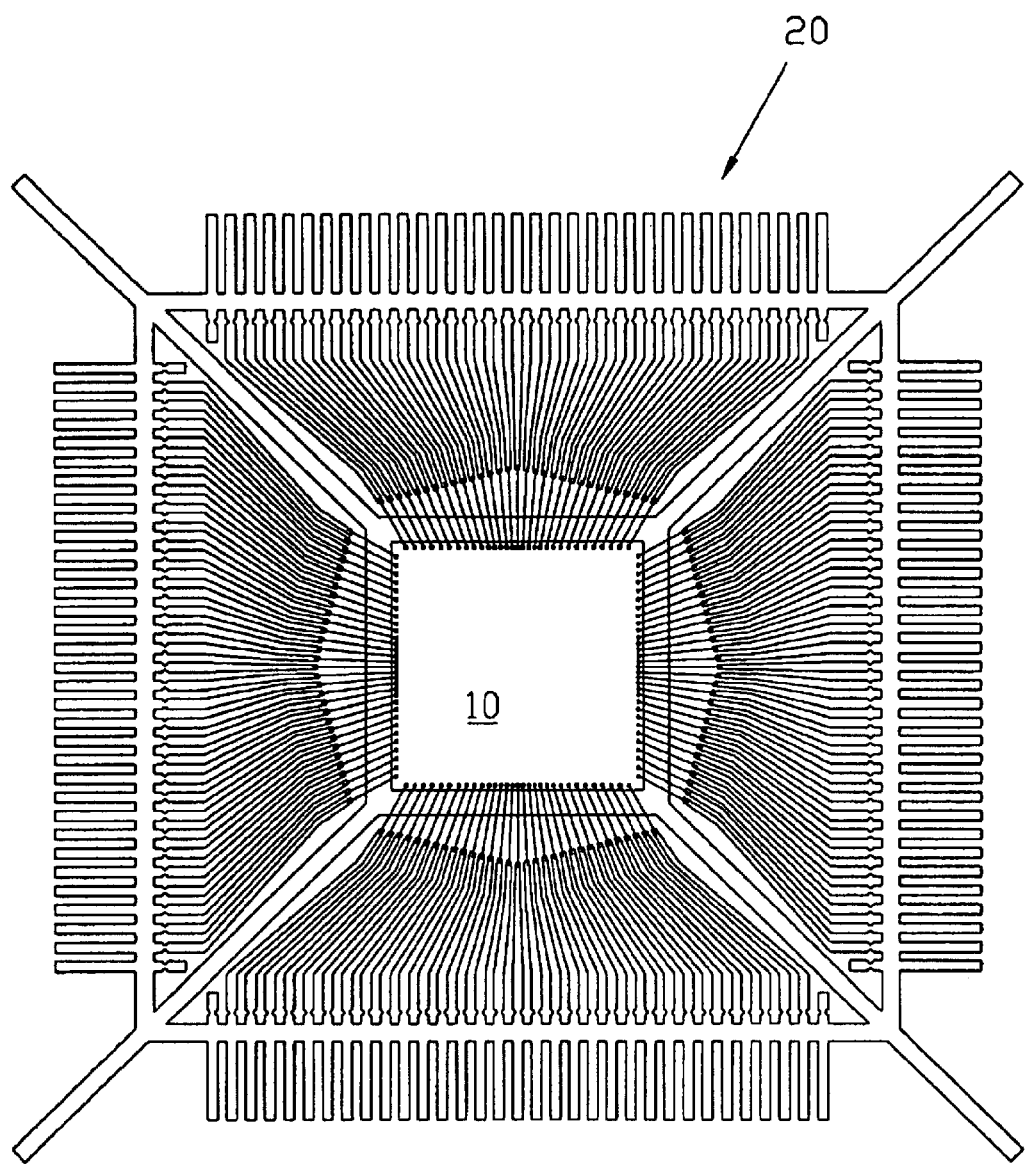
FIG. 4 is a top view of a conventional die wirebonded to a leadframe.
Figure 5:
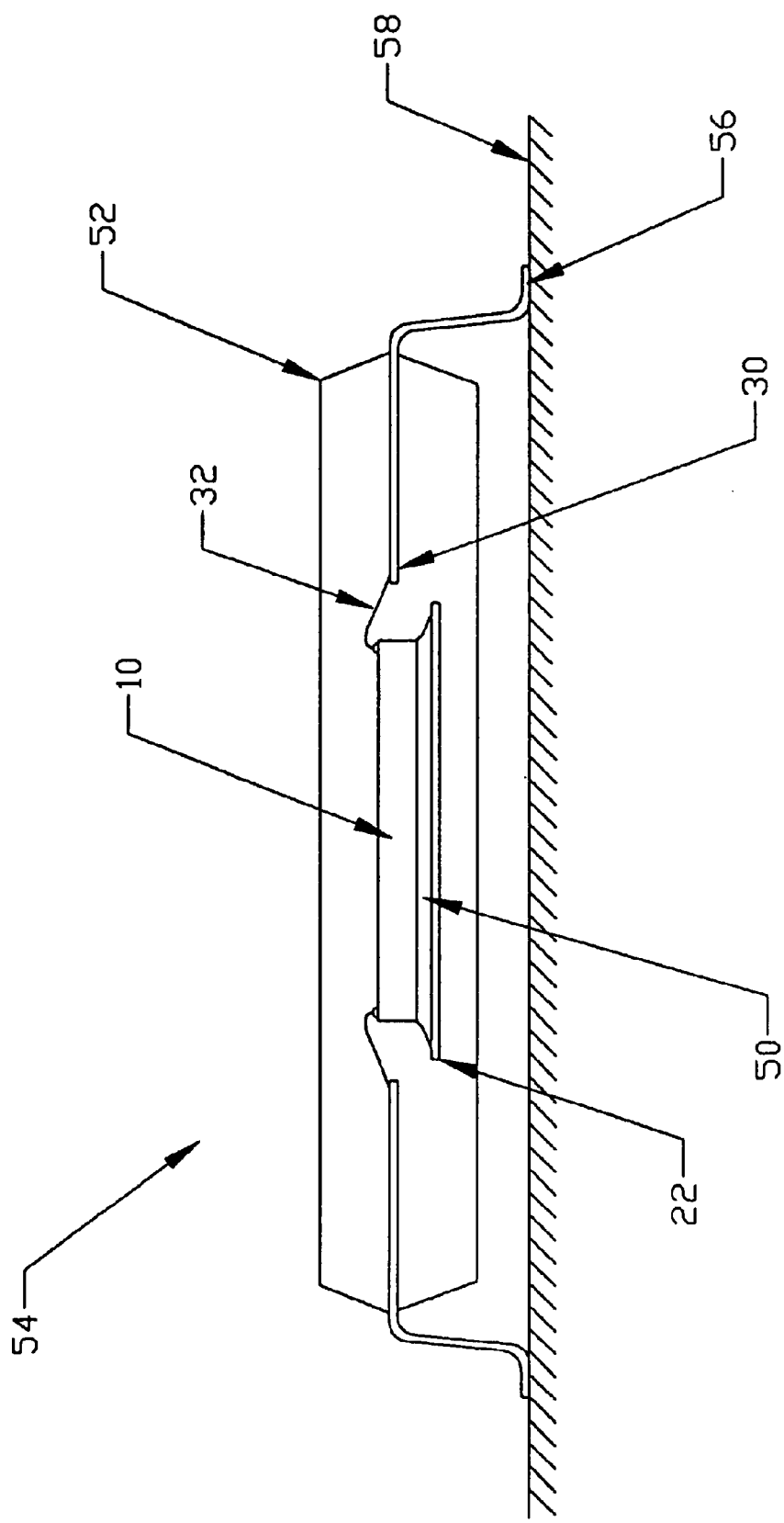
FIG. 5 is a cross-sectional view of a conventional wirebonded die inside a leadframe package.
Figure 6:
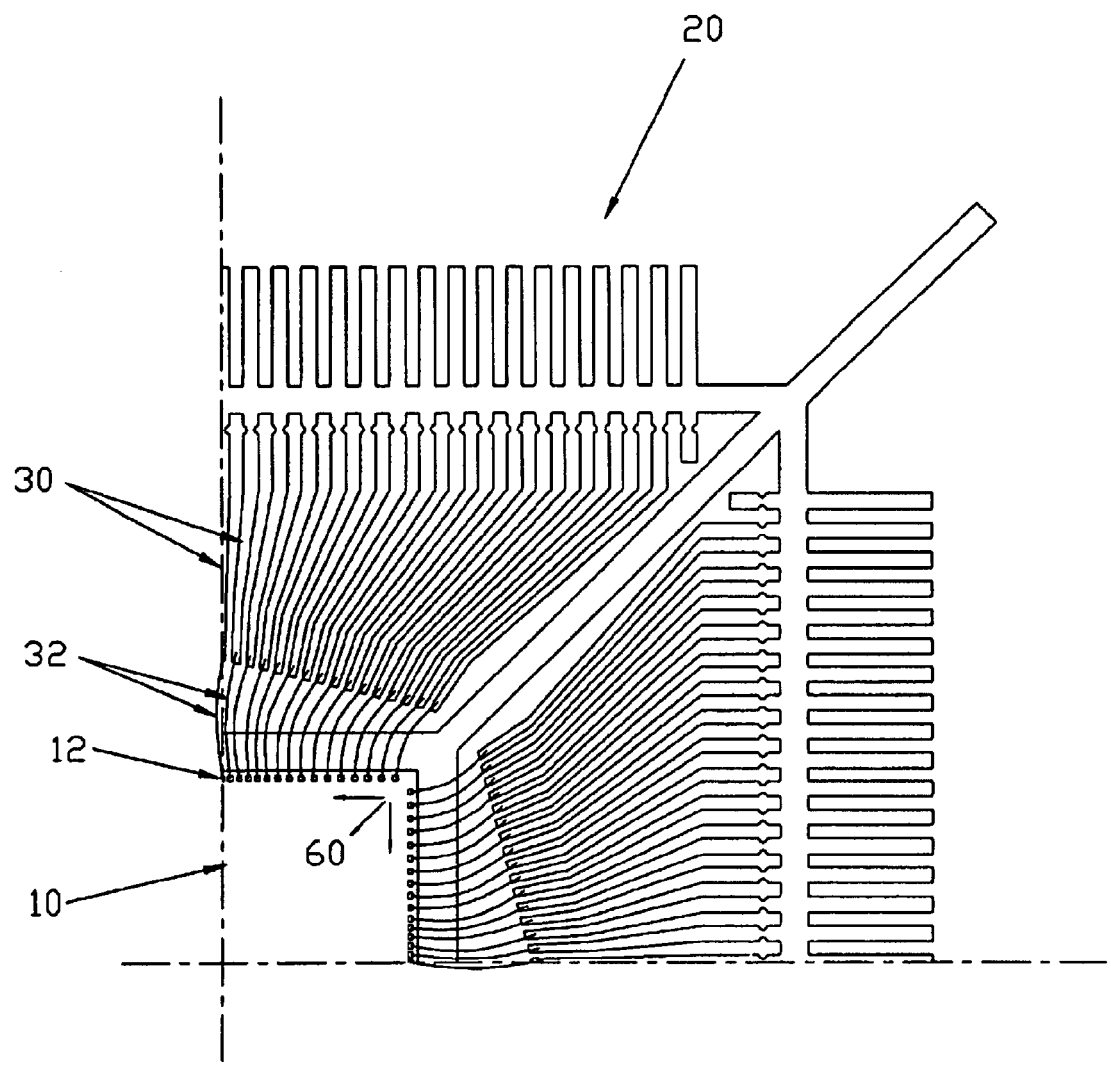
FIG. 6 is a top view of a corner of a conventional wirebonded die illustrating wire sweep.
Figure 7A:
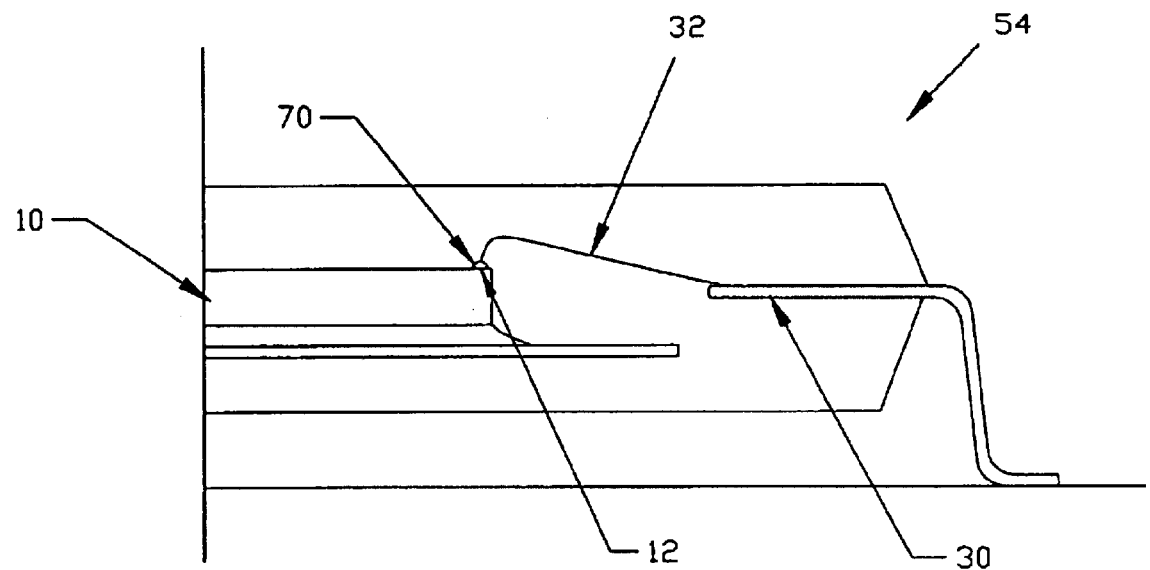
FIG. 7A is a cross-sectional view of a conventional die with a long wirebond inside a leadframe package.
Figure 7B:
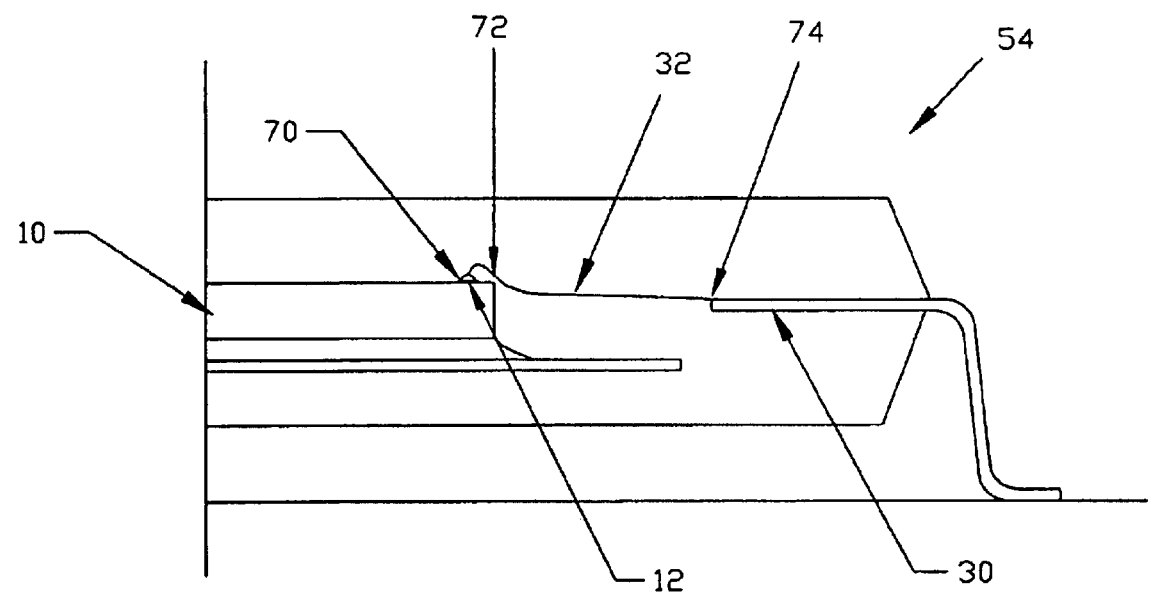
FIG. 7B is a cross-sectional view of conventional die with a long sagging wirebond inside a leadframe package.
Figure 8A:
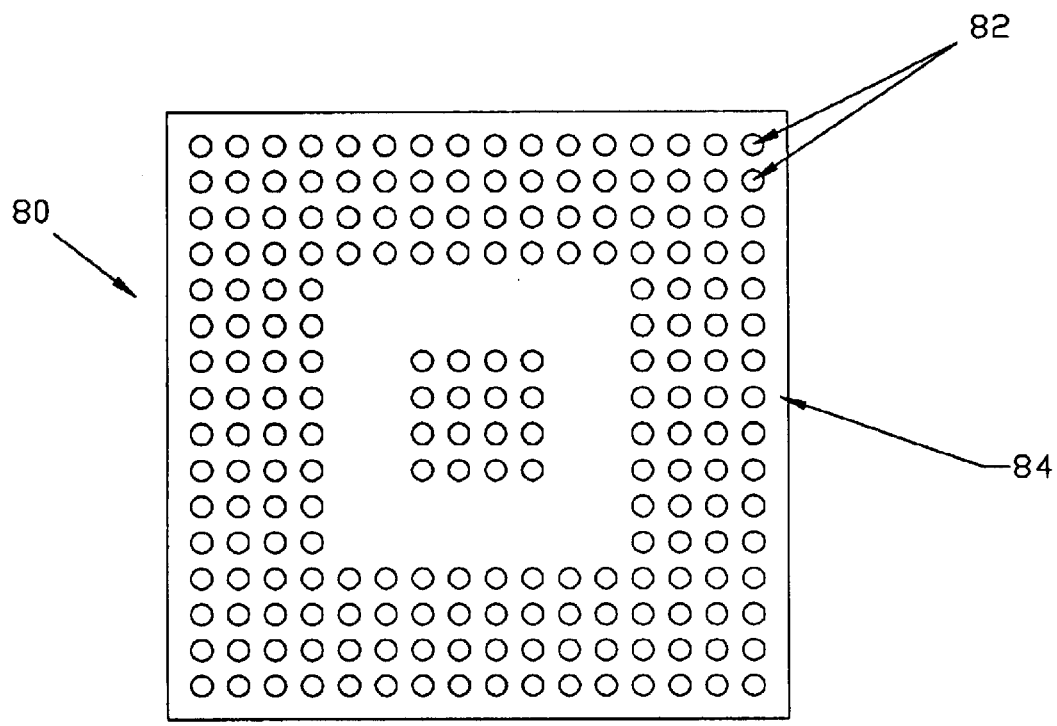
FIG. 8A is a bottom view of a conventional ball grid array (BGA) package.
Figure 8B:
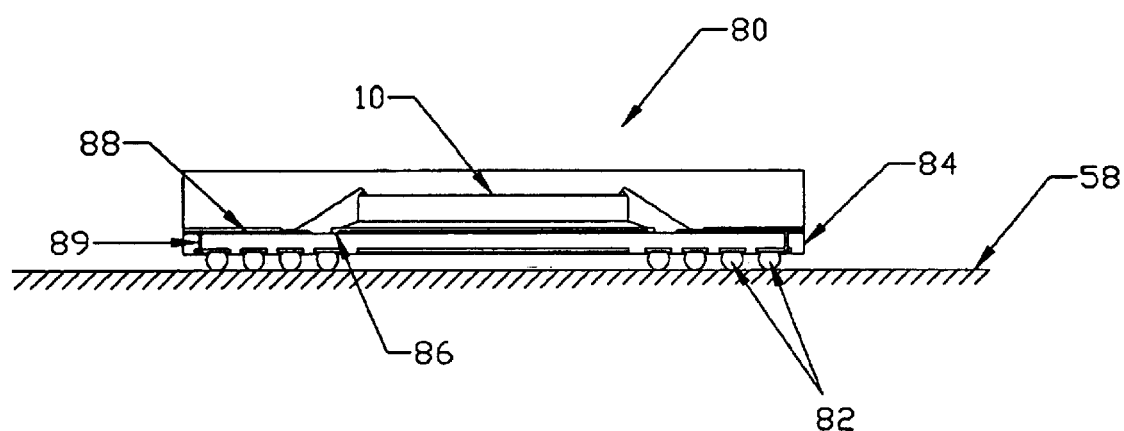
FIG. 8B is a cross-sectional view of a conventional wirebonded die inside a ball grid array (BGA) package.
Figure 9B:
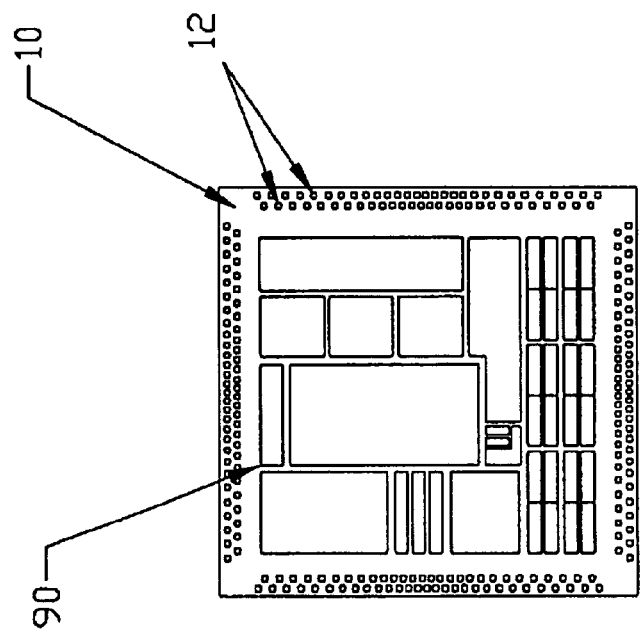
FIG. 9B is a top view of a die with staggered bond pads.
Figure 9A:
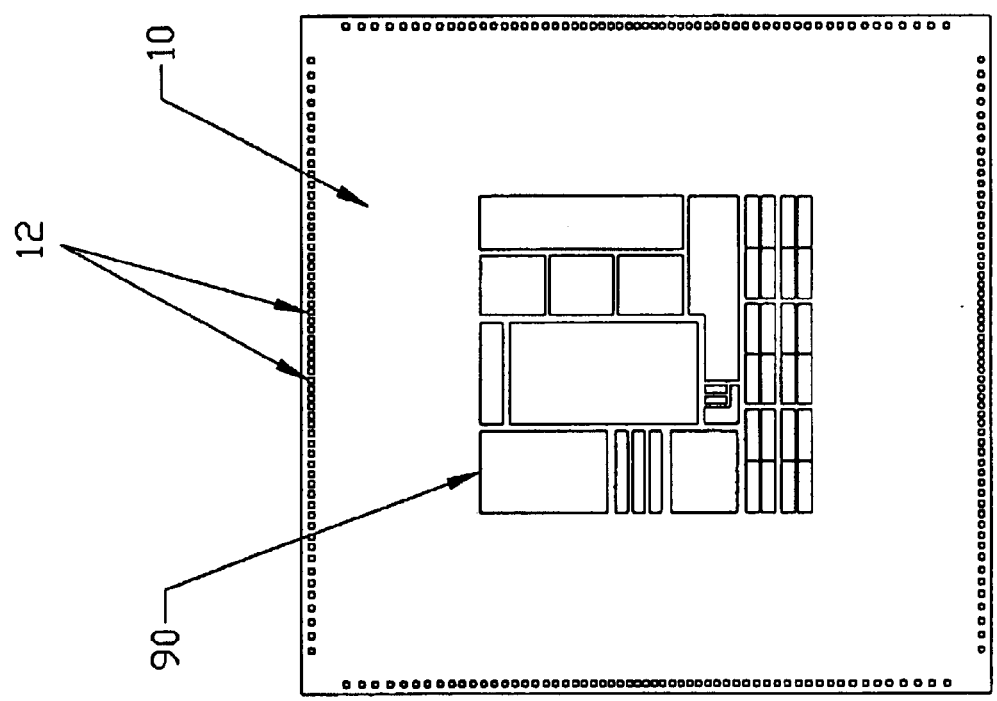
FIG. 9A is a top view of a die with a bond pad ring that is relatively large in comparison to the internal circuitry of the die.

In addition to affording tighter and more robust bonding with fine-pitch die, the preferred embodiments of the present invention allow for space conservation in other ways. Referring back to FIG. 9B, a bond pad ring may be compressed by staggering the pads 12 into two or more rows. Wirebonding staggered bond pads is often very difficult, as the reduced wire pitch and staggered wires increase the chances of a short or other mechanical failure. However, in an alternate embodiment of the present invention, as shown in FIG. 13, allows staggered pads 12 to be bonded out without the concerns of wirebonding.

Figure 13:
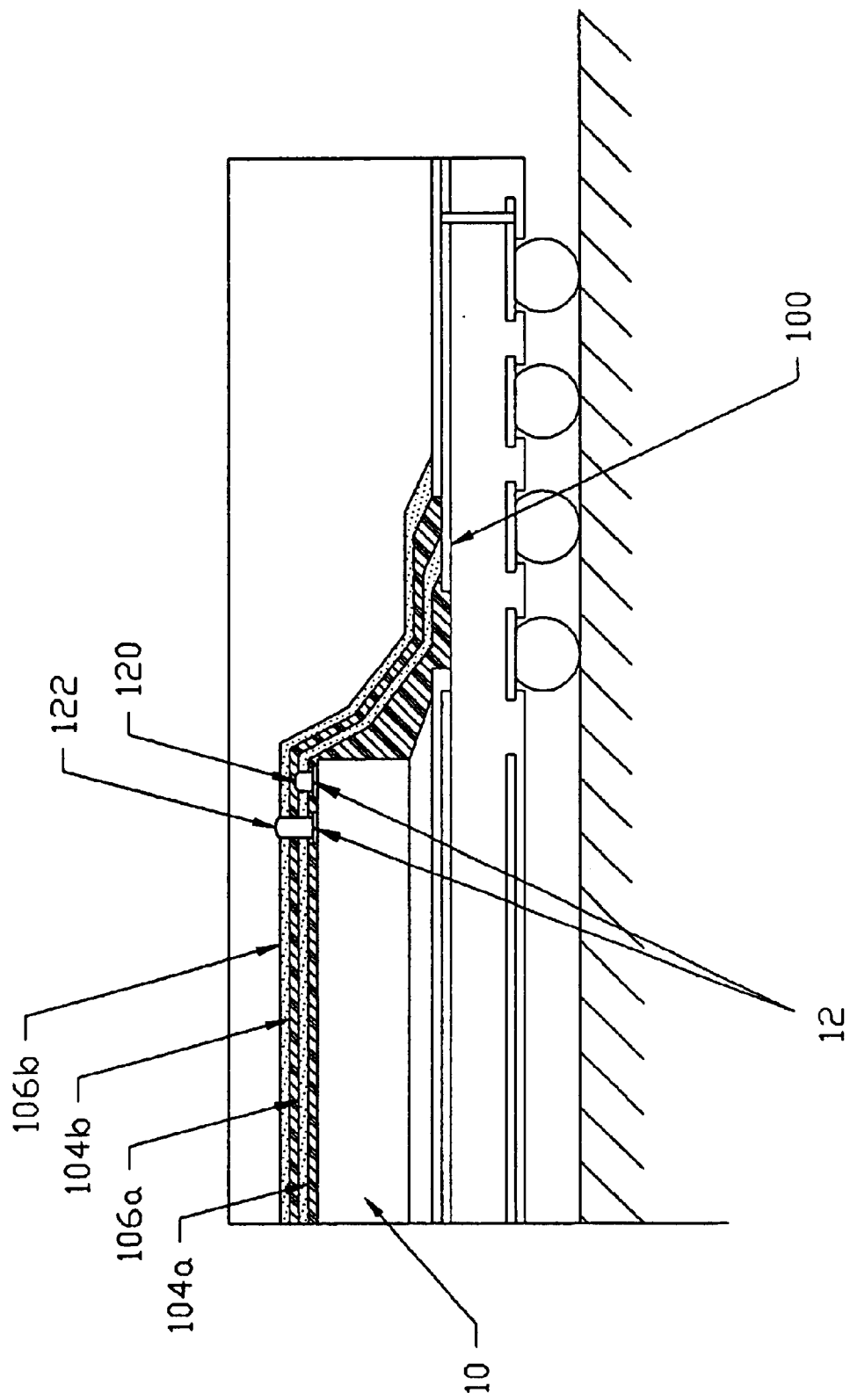

FIG. 13 shows a die with an outer ring of low-height bumps 120 and an inner ring of high-height bumps 122. An insulating layer 104a is first sprayed onto die 10, partially covering the low bumps 120 and allowing their tips to protrude through layer 104a. After a first layer of conductive ink 106a is sprayed onto die 10, contacting the ring of low bumps 120, laser trimming is performed to isolate the conductive patches (not shown) extending from the low bumps 120 to their respective substrate contacts 100.

The process is then repeated as a second insulating layer 104b is applied, this time covering the low bumps 120 completely and only partially covering the high bumps 122. A second conductive layer 106b is then applied, contacting the ring of high bumps 122. To complete the process, laser trimming is then performed to create conductive patches (not shown) extending from the high bumps 122 to their respective substrate contacts (not shown).

Figure 14A:
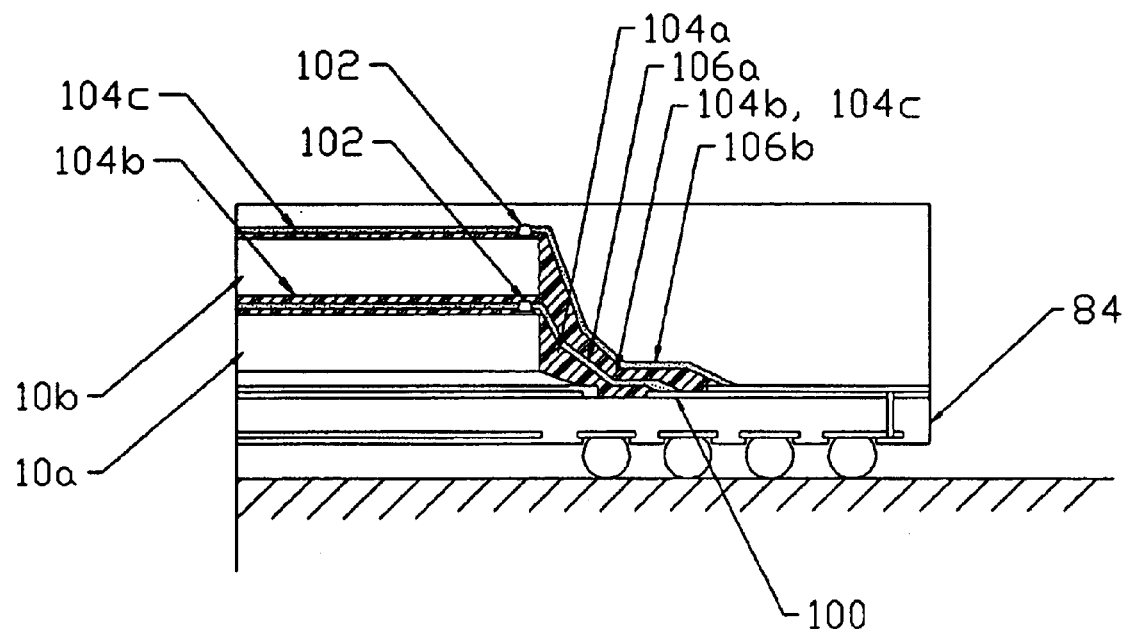
FIG. 14A is a cross-sectional view of a bumped die stacked on top of another bumped die with each die covered with insulating and conductive layers in accordance with an alternate embodiment of the present invention.

In some cases, space on a board is at such a premium that it is desirable to stack die on top of each other in a package, as shown in FIG. 14A. A similar process to that described above may be used to bond out stacked die. After depositing a first conductive layer 106a over an insulating layer 104a on the lower die 10a, laser scribing is performed to create patches in conductive layer 106a. The patches of conductive material 106a electrically connect the lower die 10a to the substrate 84. An insulating layer 104b is then applied over lower die 10a, insulating it from the die 10b to be placed on top of it.

Figure 14B:
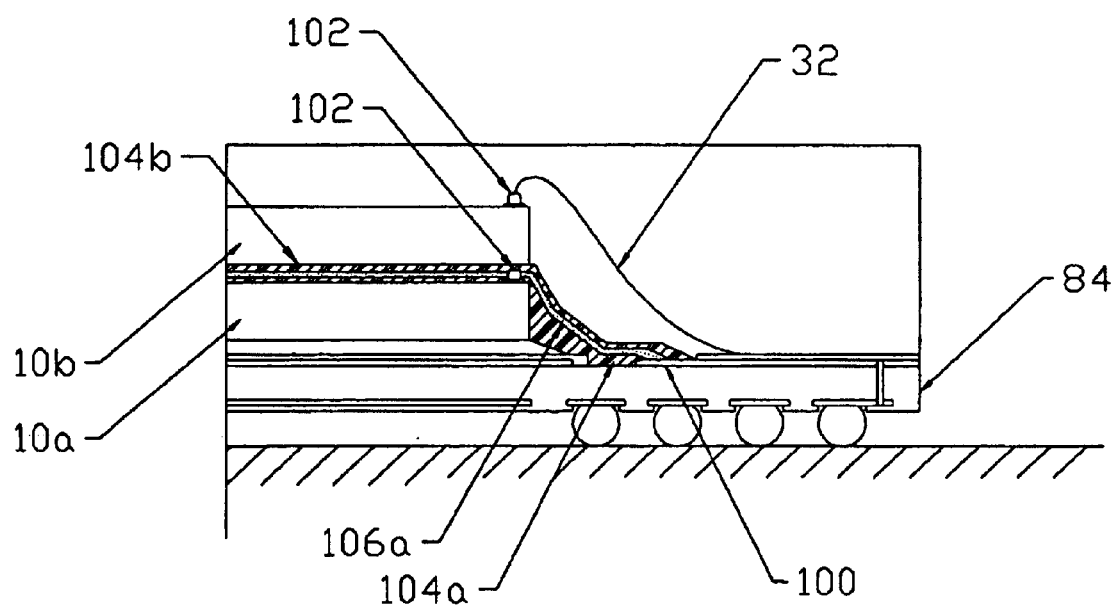
FIG. 14B is a cross-sectional view of conventionally wirebonded die stacked on top of a bumped die with the bottom die covered with insulating and conductive layers in accordance with an alternate embodiment of the present invention.

An upper die 10b is attached in place, and an insulating layer 104c is applied over it, followed by a conductive layer 106b, which is then trimmed to form patches of conductive material 106b, electrically connecting the upper die 10b to the substrate 84. Alternately, the upper die 10b may be wirebonded to the substrate 84, as shown in FIG. 14B, while the bottom die 10a utilizes the laser trim interconnect method of the present invention.

Figure 15:
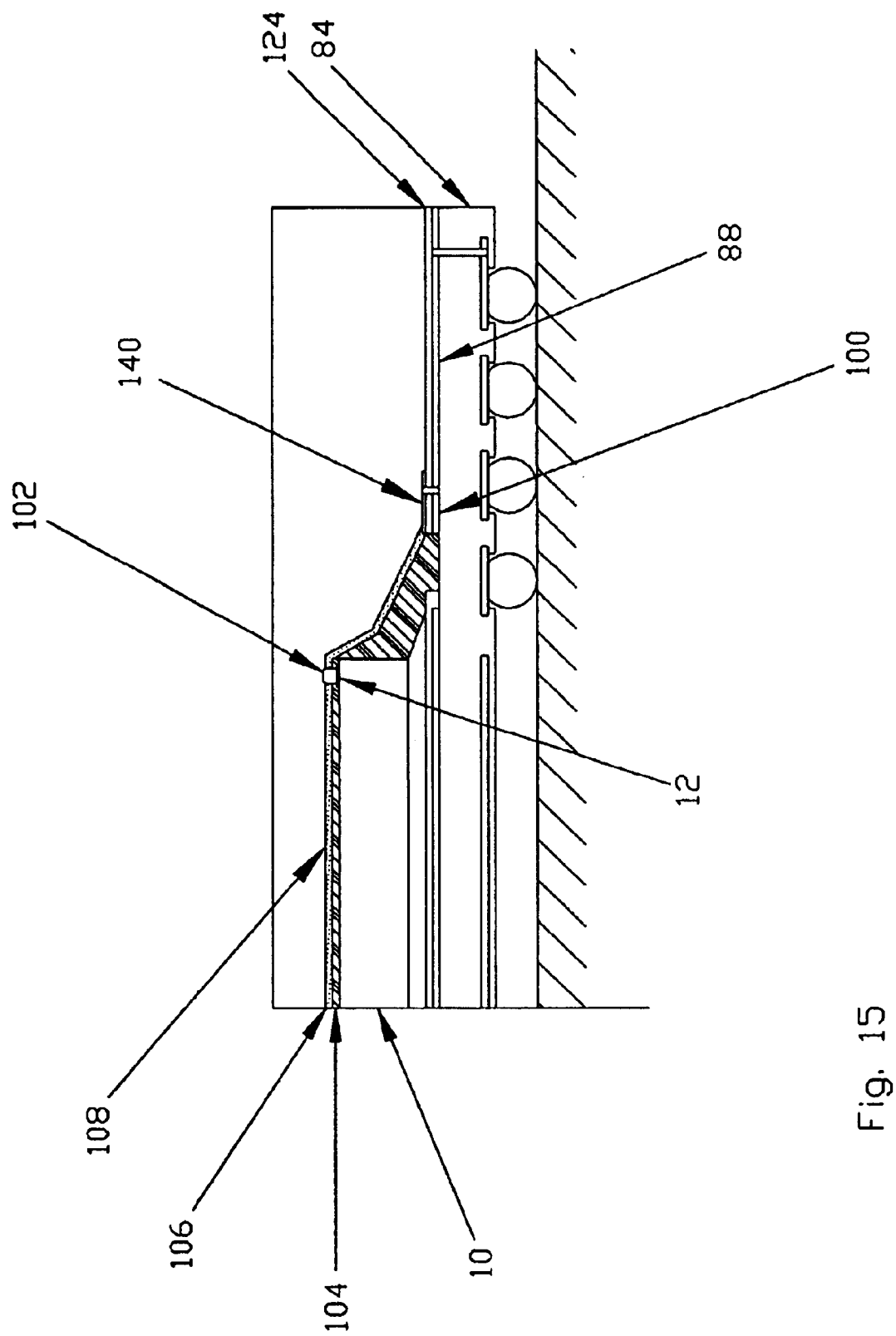
FIG. 15 is a cross-sectional view of a bumped die bonded to a substrate stitch in accordance with a preferred embodiment of the present invention.

Substrates 84 used with the laser trim interconnect method may utilize conventional contact pads 100, shown previously in FIG. 12, in which an opening exists in a solder mask layer 124 to expose the underlying metal contact pad 100, which conductive patch 108 would contact, at the end of a substrate trace 88. Alternately, as shown in FIG. 15, a metal stitch 140 could be created on top of the surface of substrate 84, serving as the contact pad for the conductive patch 108 to interconnect with the substrate trace 88.

Various manufacturing processes can be utilized to assemble semiconductors in accordance with the preferred embodiments of the present invention. Metal ion coating may be used as a conductive layer in another embodiment of the present invention. Similarly, any suitable insulating material, such as glass, may be used in addition to epoxy or polyimide.

The laser trim interconnect method is a semiconductor packaging method that diminishes many of the assembly, performance and reliability issues associated with existing interconnect methods while permitting the possibility of more aggressive assembly options, greater thermal and electrical performance and space conservation than conventional wirebonding and permitting a widely applicable interconnect method.

Numerous variations and modifications will become apparent to those skilled in the art once the above disclosure is fully appreciated. Special designs of the insulating or conductive materials can have additional functions, such as an insulating serving as a dam or guide to control the flow of the conductive material.

What is claimed is:

1. A method of electrically connecting a semiconductor die to a package substrate, comprising:

(a) applying an electrically non-conductive material covering at least a portion of said die and extending onto said substrate to a plurality of contact pads formed on said substrate; and (b) applying an electrically conductive material over said non-conductive material and extending from an electrical point of contact of said die to at least one contact pad on said substrate, wherein the conductive material is separated into a plurality of conductive patches by laser trimming away portions of the conductive material.

2. The method as claimed in claim 1, wherein a hole is trimmed into the non-conductive material over and down to at least one bond pads, exposing at least a portion of each bond pad to be connected.

3. The method as claimed in claim 1, wherein an electrically conductive bump is formed on each said bond pad, said bump protruding through said non-conductive material and at least partially through said conductive material.

4. The method as claimed in claim 1, wherein the non-conductive material comprises a non-conductive epoxy.

5. The method as claimed in claim 1, wherein the non-conductive material comprises a non-conductive polyimide.

6. The method as claimed in claim 1, wherein the electrically conductive material comprises conductive ink.

7. The method as claimed in claim 1, wherein the electrically conductive material comprises a metal ion coating.

8. The method as claimed in claim 1, wherein (a) includes spinning the non-conductive material onto the die and package substrate.

9. The method as claimed in claim 1, wherein (a) includes spraying the non-conductive material onto the die and package substrate.

10. The method as claimed in claim 1, wherein (b) includes spinning the non-conductive material onto the die and package substrate.

11. The method as claimed in claim 1, wherein (b) includes spraying the non-conductive material onto the die and package substrate.

* * * * *

UNITED STATES PATENT AND TRADEMARK OFFICE
CERTIFICATE OF CORRECTION

PATENT NO.    : 6,756,252 B2
DATED         : June 29, 2004
INVENTOR(S)   : Nakanishi It is certified that error appears in the above-identified patent and that said Letters Patent is hereby corrected as shown below:

Title page,
Item [73], Assignee, change "Texas Instrument Incorporated" to -- Texas Instruments Incorporated --.

Signed and Sealed this

Twenty-third Day of November, 2004

JON W. DUDAS
*Director of the United States Patent and Trademark Office*